(12) United States Patent
Tester

(10) Patent No.: US 6,741,670 B2
(45) Date of Patent: May 25, 2004

(54) COUNTER CIRCUIT AND RESET THEREFOR

(75) Inventor: David Tester, Preston (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/134,740

(22) Filed: Apr. 29, 2002

(65) Prior Publication Data

US 2003/0202628 A1 Oct. 30, 2003

(51) Int. Cl.⁷ ................................................ H03K 21/38
(52) U.S. Cl. ......................... 377/107; 377/114; 327/217
(58) Field of Search ................................. 377/107, 114; 327/217, 200, 198

(56) References Cited

U.S. PATENT DOCUMENTS 6,091,794 A * 7/2000 Rogers ........................ 377/116
6,366,113 B1 * 4/2002 Song ............................. 326/24
6,515,528 B1 * 2/2003 Tohsche ....................... 327/203

* cited by examiner

*Primary Examiner*—Margaret R. Wambach
(74) *Attorney, Agent, or Firm*—Christopher P. Maiorana PC

(57) ABSTRACT

A counter stage generally comprises a flip-flop and a reset circuit. The flip-flop may be configured to toggle a flip-flop signal between a first and a second state in response to a count signal applied to a clock input to effect a counting operation. The reset circuit may be configured to reset the counter stage to a predetermined state without changing the state of the flip-flop signal.

21 Claims, 5 Drawing Sheets

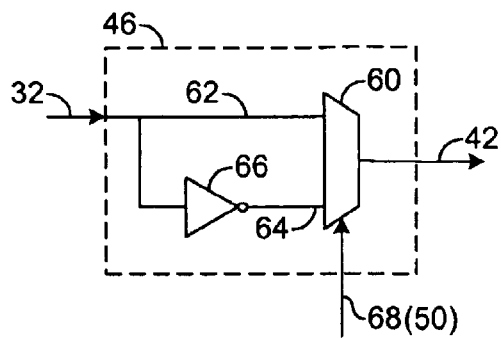
FIG. 4
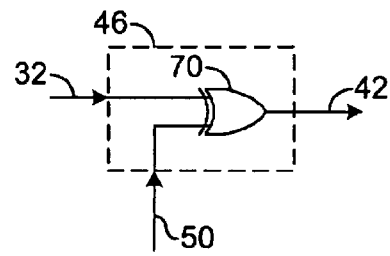
FIG. 5
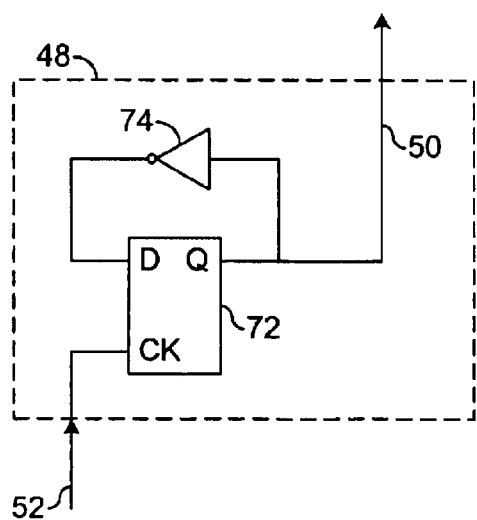
FIG. 6
| A | B | C | D | E |
|---|---|---|---|---|
| 1 | 0 | 1 | 0→1 | 0 |
| 0 | 1 | 1 | 1→0 | 0 |
FIG. 7

COUNTER CIRCUIT AND RESET THEREFOR

FIELD OF THE INVENTION

The present invention relates to a digital counter, and to a reset technique therefor. The invention is especially, but not exclusively, suitable for a ripple counter. The invention is also especially, but not exclusively, suitable for incorporation in an integrated circuit.

BACKGROUND TO THE INVENTION

FIG. 1 shows schematically the principle of a self-looping ripple counter 10. The counter 10 comprises a plurality of flip-flop counter stages each arranged with an inverted output fed back to an input. The first stage 12a toggles on each input clock cycle. Each subsequent counter stage 12 toggles at half the rate of the preceding stage. Modulo-N detection circuitry 14 monitors the count value in the plural stages, and generates a reset signal 16 when the count value has reached a predetermined maximum (which typically might not be a power of 2). The reset signal 16 is applied in parallel to reset circuitry 18 built in to each flip-flop 12, to force the flip-flop to a certain state, typically zero.

A disadvantage with the above type of circuit is that the reset circuitry 18 in each flip-flop 12 slows the maximum rate at which the flip-flop can toggle. Typically the reset circuitry comprises one or more semiconductor devices, which add capacitance to the circuit. In some situations, speed is not important. However, modern designs place an ever increasing importance on obtaining increased speed at minimum power consumption, which often means operating circuitry at its limit.

For example, using 0.18 micron CMOS integrated circuit technology, the theoretical maximum clocking speed of a flip-flop, for a particular logic family operating within a required power consumption level, might be about 1 GHz. However, in practice, the reset circuitry 18 typically reduces this speed by 20% to about 800 MHz. Therefore, more power demanding circuits have to be used for speeds above 800 MHz.

In a ripple counter, the toggle speed of flip-flop 12 places two limitations on the circuit 10. Firstly, it limits the maximum counting rate of the circuit by the physical speed at which the first flip-flop 12a can toggle, since the first flip-flop 12a operates at the highest rate. Secondly, it limits the counting speed by causing propagation delay through the plural flip-flops 12, and delaying the stable count value. It will be appreciated that the modulo-N detection circuit 14 requires a stable count value to detect the occurrence of the predetermined maximum. If another count input arrives at the first flip-flop 12a before the previous count value has "rippled" through the last flip-flop, then the count value will not be stable for detection. This second problem is more serious for long ripple counters containing many stages flip-flops 12.

Finally, a further disadvantage with current reset circuits 18 is that they are level-driven, rather than edge-driven. The reset signal 16 therefore has to be applied and held for at least a certain minimum duration to achieve the reset, during which time the flip-flops 12 cannot toggle. This places a further time limitation on the maximum continuous counting rate of the circuit 10. This also limits the ability of the circuit 10 to count for a predetermined time following the occurrence of the count value causing the circuit 10 to reset.

SUMMARY OF THE INVENTION

The invention relates to a counter stage which may comprise a flip-flop and a reset circuit. The flip-flop may be configured to toggle a flip-flop signal between a first and a second state in response to a count signal applied to a clock input to effect a counting operation. The reset circuit may be configured to reset the counter stage to a predetermined state without changing the state of the flip-flop signal.

The objects, features and advantages of the invention include one or more of: (i) increasing the toggling speed of the count stage flip-flop by removing a reset circuit from the counting loop of the flip-flop; (ii) reducing the time required to reset a stage; and/or (iii) increasing the maximum count speed of a ripple counter. Other objects, features and advantages will become more apparent from the description, claims and drawings.

BRIEF DESCRIPTION OF THE DRAWINGS

Non-limiting embodiments of the invention are now described, by way of example only, with reference to the accompanying drawings, in which:

FIG. 4 is a schematic block diagram showing a first example of the controllable inverter of FIG. 2;

FIG. 5 is a schematic block diagram showing a second example of the controllable inverter of FIG. 2;

FIG. 6 is a schematic block diagram showing a first example of the control circuit of FIG. 2;

FIG. 7 is a logic table for explaining the operation of the control circuit of FIG. 6.

DETAILED DESCRIPTION OF PREFERRED EMBODIMENTS

Figure 2:
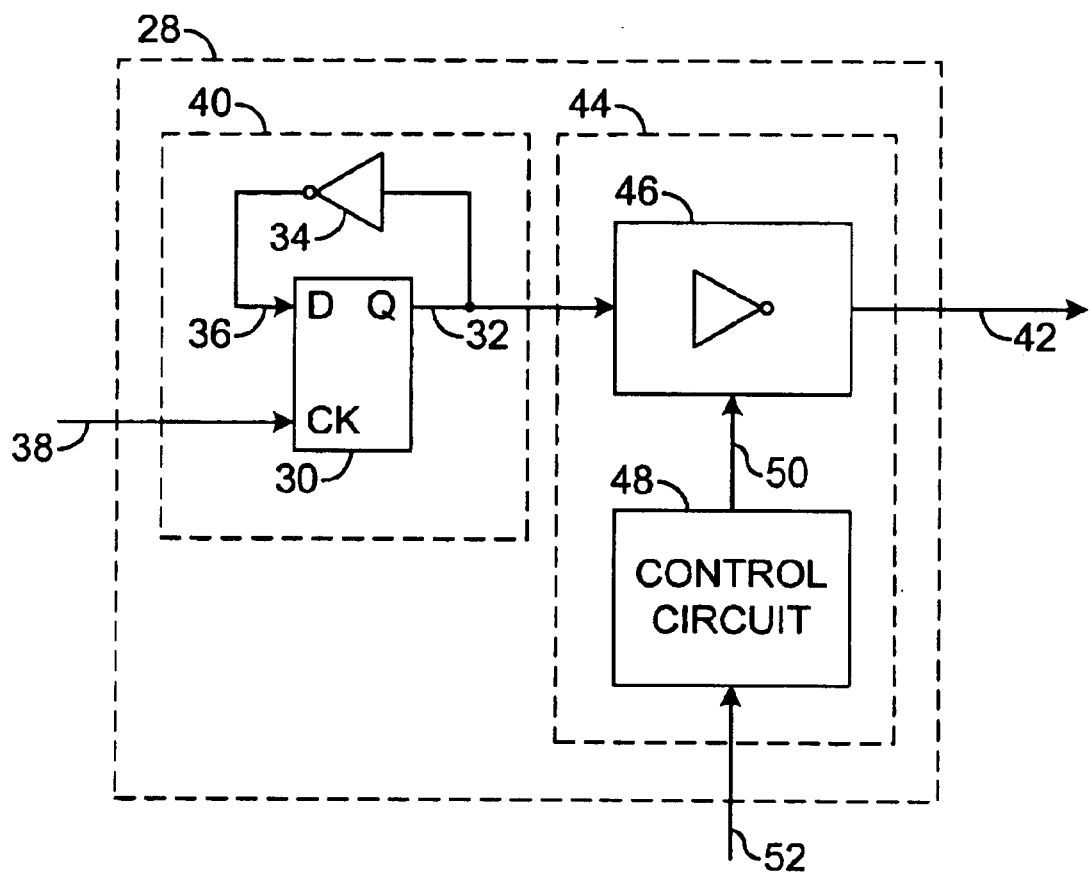
FIG. 2 is a schematic block diagram showing the principles of a first embodiment of the present invention.

Referring to FIG. 2, the principles of a first embodiment of the invention are first discussed. FIG. 2 shows a counter stage 28 including a flip-flop 30, for example, a D-type flip-flop. As in a conventional stage of a ripple counter, a Q output signal 32 of the flip-flop 30 may be fed back through an inverter 34 to a D input 36. Each time the flip-flop 30 receives a pulse at clock input 38, the state of the flip-flop 30 generally toggles either from a logic 1 to logic 0, or from logic 0 to logic 1. Instead of using an inverter 34, if the flip-flop 30 has a differential output, then the inverted output may be fed back directly (and this applies to all of the circuits herein).

A portion of the circuitry within a feedback loop section 40 may directly affect the speed of the flip-flop 30, since such circuitry may affect the speed at which the flip-flop 30 can react to the inverted output fed back to toggle the flip-flop 30. Any unnecessary circuitry in the section 40 may reduce the speed, for example, by adding capacitance to the circuit, and reducing a slew rate. In contrast to the conventional flip-flops 12 of FIG. 1, in the present embodiment, the flip-flop 30 does not contain any internal reset circuitry. Removing the conventional reset circuitry from the section 40 generally removes one source of such speed limitation.

The reset technique of the present embodiment relies on the fact that, since the flip-flop 30 only has two states, and toggles in order to count, a reset may not alter the state of the flip-flop 30 itself. Instead, the output signal 32 from the flip-flip 30 can be selectively inverted so that an output signal 42 fed to downstream circuitry has the correct state following the reset, even if the flip-flop 30 has a non-reset state. More specifically, at the time of a reset, the existing state of the flip-flop 30 may be known (from its output 32), as may be a desired state after the reset. If the two states (e.g., current and desired) are the same, then no modification of the output signal 32 from the flip-flop may be performed, and the signal 42 may be the same as the output signal 32. If the two states (current and desired) are not the same, then the output signal 32 from the flip-flop 30 may be inverted, so that the signal fed to downstream circuitry may have the correct, opposite state following the reset. In other words, the flip-flop 30 may not itself be reset; instead, the output signal 32 may be selectively inverted to make the output signal 42 appear as if the flip-flop 30 had been reset.

A reset circuitry 44 of the present embodiment generally comprises a controllable inverter 46 for selectively inverting the output signal 32 from the flip-flop 30 to "effect" a reset by inverting the output signal 32 if the output signal 32 does not already have the state desired following the reset. A control circuitry 48 may generate a binary control signal 50 for controlling the controllable inverter 46. The control circuit 48 generally has a reset input 52, and generates the appropriate control signal 50 to cause the output signal 42 to have the correct state.

As explained above, a major advantage of moving the reset circuitry 44 out of the feed back loop section 40 is that the reset circuitry 44 may not limit the slew rate of the flip-flop 30 to the same extent as does conventional reset circuitry built-in to a conventional flip-flop 12. For the previously described logic family in a 0.18 micron CMOS integrated circuit technology, the count speed may approach 950 MHz, which is approximately 95% of the theoretical maximum count speed, providing a significant speed increase compared to the 800 MHz maximum for the arrangement of FIG. 1

Figure 1:
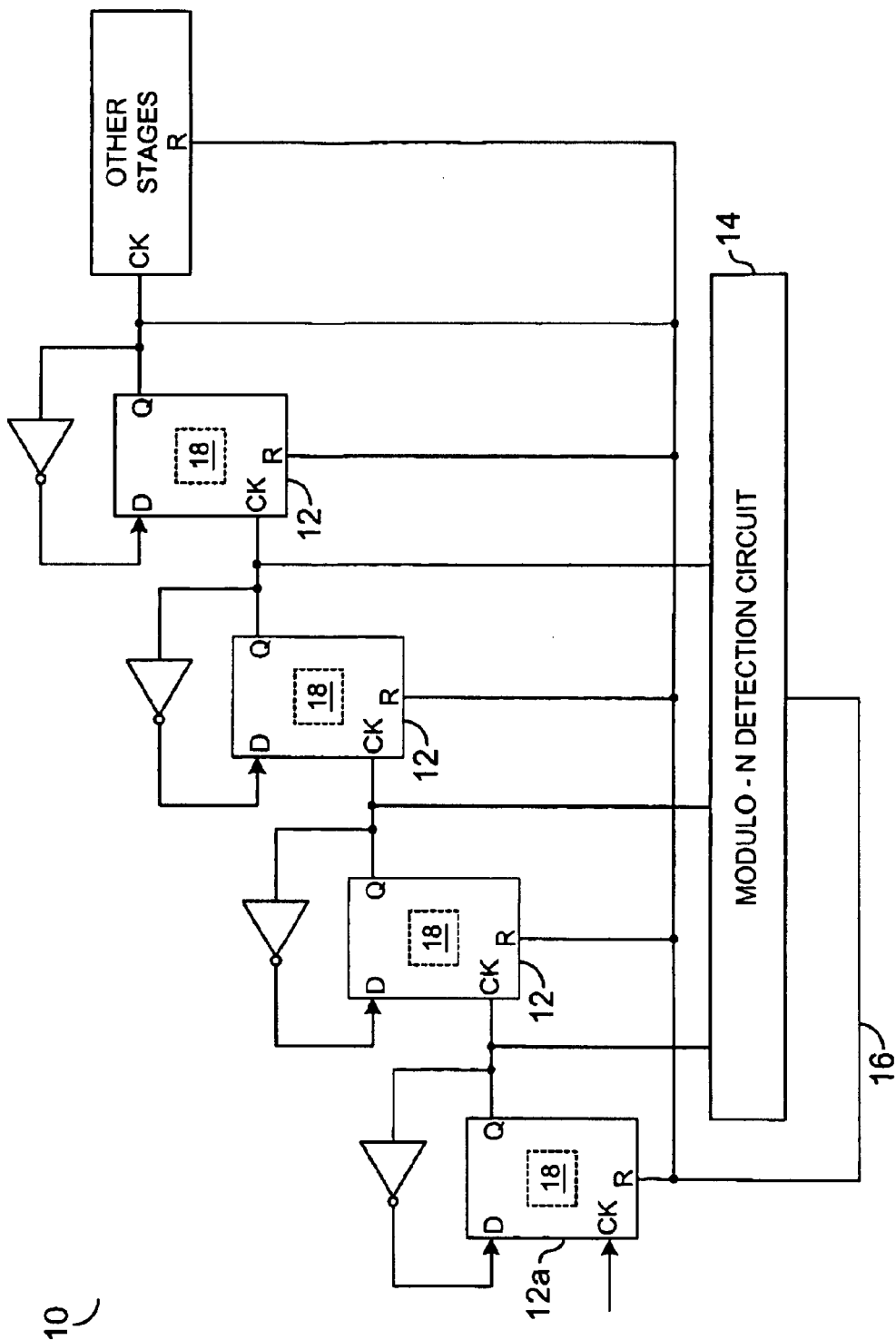
FIG. 1 is a schematic block diagram of a conventional self-looping ripple counter.
Figure 3:
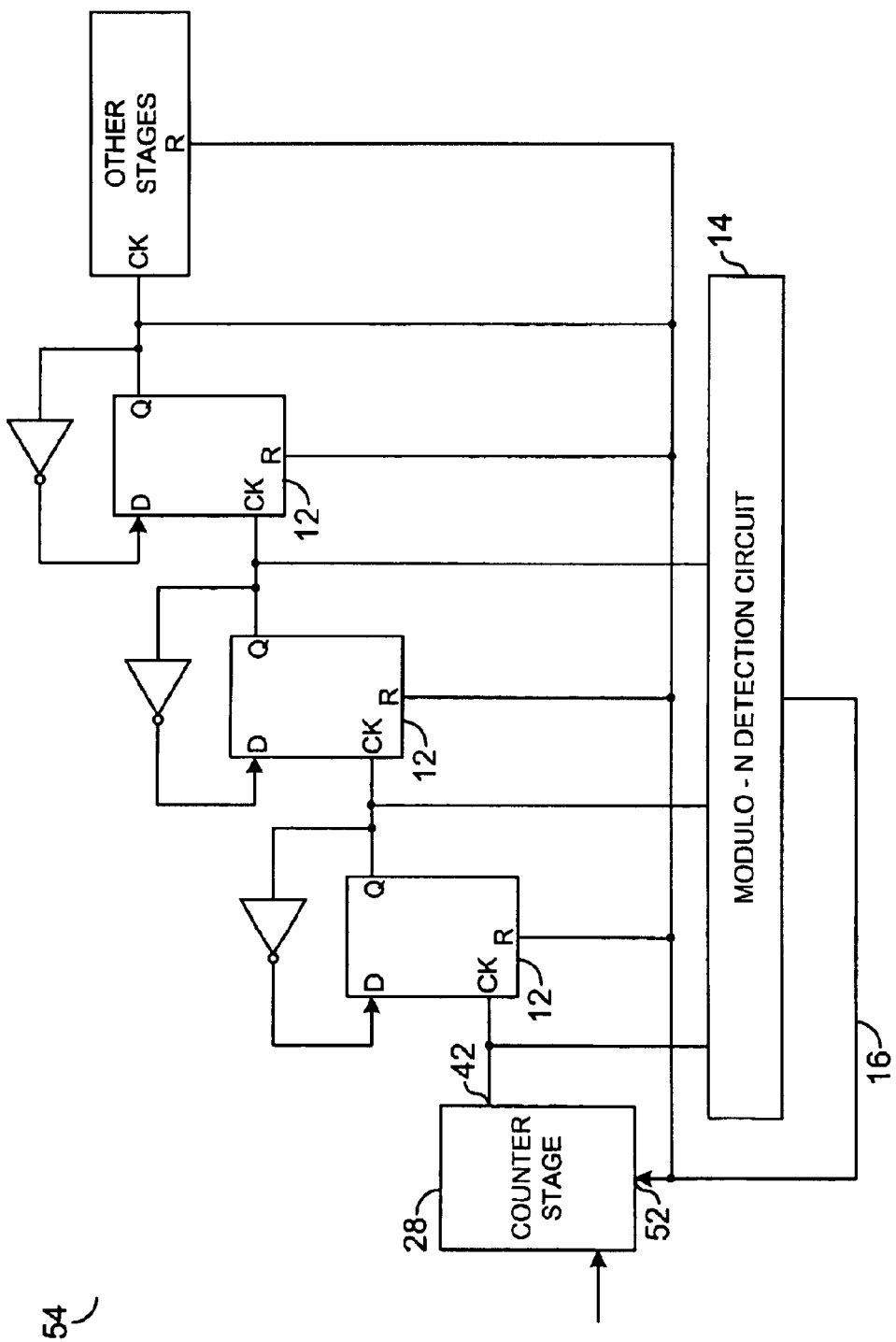
FIG. 3 is a schematic block diagram showing a ripple counter employing a counter stage of the first embodiment.

FIG. 3 illustrates an embodiment of a ripple counter 54 including the counter stage 28 of the first embodiment. The same reference numerals as those of FIG. 1 are used where appropriate. Compared to FIG. 1, the first flip-flop 12*a* may be replaced by the counter stage 28, since the initial stage counter stage is generally the most speed sensitive. As explained previously, the other downstream flip-flop counter stages 12 toggle at progressively lower rates, and so conventional flip-flops 12 may be used after the first stage, if desired. The counter stage 28 may include more complicated circuitry than the conventional flip-flops 12, and so using the conventional flip-flops 12 may also reduce circuit overhead.

The reset signal 16 from the modulo-N detection circuitry 14 may be fed to the reset input 52 of the control circuit 48 of the counter stage 28, and to the reset inputs of the conventional flip-flops 12. The output signal 42 from the counter stage 28 may be coupled as the input to the next count stage, and as the first count stage input to the Modulo-N detection circuit 14.

In one embodiment, some or all of the conventional flip-flops 12 may be replaced by counter stages 28. This may be especially advantageous for long ripple counters including many flip-flop stages, in order to reduce the propagation delay through the ripple counter 54.

FIG. 4 illustrates a first example of a controllable inverter 46, generally comprising a multiplexer 60 receiving a first direct input path 62, and a second inverted input path 64 provided by a fixed inverter 66. The multiplexer 60 generally has a control input 68 for receiving the control signal 50 to select either the direct (non-inverted) signal path 62 (for example, when the control signal 50 is logic 0) or the inverted signal path 64 (for example, when the control signal 50 is logic 1).

FIG. 5 illustrates a second example of a controllable inverter 46, generally comprising an exclusive-OR (XOR) gate 70 having a first input receiving the signal 32 from the flips flop 30, and a second input receiving the control signal 50. While the control signal 50 is logic 0, the signal 32 may be provided unchanged as the output signal 42. While the control signal 50 is logic 1, the output signal 42 may be inverted with respect to the signal 32.

FIG. 6 illustrates an example of the control circuitry 48 for controlling the controllable inverter 46. This example may be configured for a specific situation in which, upon reset, it is generally known that the output (42) from the counter stage should be "reset" from one state (e.g., logic 1) to the opposite state (e.g., logic 0). The control circuitry 48 generally comprises a flip-flop 72 and an inverter 74 configured in a self-toggling arrangement (in a similar manner to the flip-flop 30 and inverter 34 described above).

The reset input 52 may be applied as the clock input to the flip-flop 72, causing the flip-flop 72 to toggle each time that a reset input arrives.

The operation is illustrated in the logic table of FIG. 7. In FIG. 7, column A generally represents the state of the flip-flop output signal 32 prior to a reset, column B generally represents the state of the control signal 50 prior to a reset, column C generally represents the output signal 42 prior to the reset, column D generally represents a change in the control signal 50 upon a reset, and column E generally represents the output 42 upon the reset. Initially, it may be assumed that the control signal 50 is at logic 0, such that the output 42 from the counter stage 28 may be the same as the output signal 32 from the flip-flop 30 (e.g., flip-flop 30 is "in phase"). When the count value reaches a predetermined maximum (at which the output signal 42 may be a logic 1), the reset signal may be applied at the input 52, for example, from the modulo-N detection circuitry 14 described previously. The reset signal generally causes the flip-flop 72 to toggle, so that the control signal 50 goes from logic 0 to logic 1. The toggling of the control signal 50 generally causes the controllable inverter 46 to invert the output 42, with respect to signal 32, so that the output 42 becomes logic 0. This gives the appearance that the counter stage 28 has been "reset" to logic 0.

During the next count loop, the control signal 50 may remain at logic 1, so that the output signal 42 may be "out of phase" with the flip-flop output 32. Upon the count value again reaching the predetermined maximum (at which the output signal 42 may be a logic 1), the reset signal may again be applied at the input 52. The reset signal generally causes the flip-flop 72 to toggle, so that the control signal 50 goes from logic 1 to logic 0. The toggling of the control signal 50 generally causes the controllable inverter 46 to de-invert the output signal 42 with respect to the flip flop output signal 32, so that the output signal 42 again becomes a logic 0. This returns the output signal 42 to be "in-phase" with the flip-flop output signal 32, and the sequence repeats continuously for the next count loop.

The counter stage 28 thus may have two cycles between which it generally alternates. The first may be the "in phase" cycle in which the output signal 42 may be the same as the flip-flop output signal 32, and the second may be the "out of phase" cycle in which the output signal 42 may be inverted with respect to the flip-flop output signal 32. Toggling between these cycles generally provides the reset function.

Where the reset generally occurs with the output signal 32 in the same state, (i) the counter stage 28 may operate in just one of the "in phase" or the "out of phase" cycles, and (ii) the reset circuitry 44 may be eliminated.

Similar principles apply for resetting the output signal 42 to logic 1, when just prior to the reset, the output signal 42 may be logic 0.

A further advantage of the circuit of FIG. 6 may be that, within the circuits 46 and 48, the reset operation may be caused by the toggling of the flip-flop 72 in response to a reset pulse. The flip-flop 72 is typically edge-driven (e.g., triggered by a rising or falling transition edge of the reset pulse), so that the counter stage 28 may be reset from an edge of the reset signal. This may provide speed advantages compared to level-driven reset circuitry of conventional flip-flops.

Figure 8:
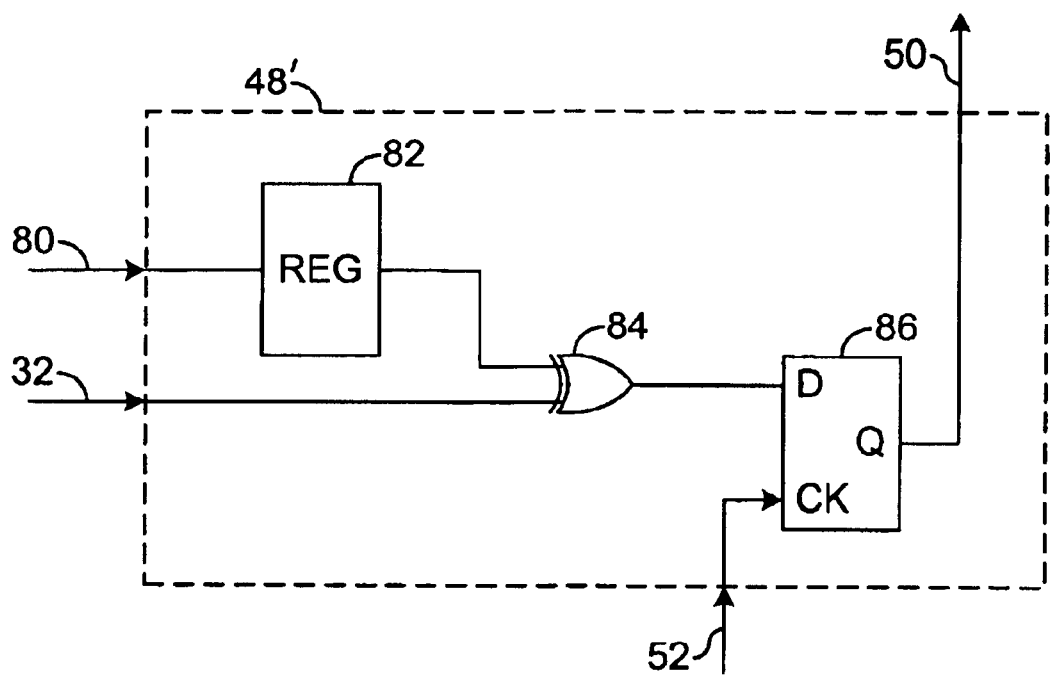
FIG. 8 is a schematic block diagram showing a second example of the control circuit of FIG. 2.

FIG. 8 shows a second, more generic example of a control circuit 48 which may be used to reset the counter stage 28 to an externally defined state (either logic 1 or logic 0) received from an external input 80. This type of circuit may be advantageous for loading a desired count value into a ripple counter. For example, by loading a predefined value, and incrementing or decrementing to zeros, the modulo-N detection circuitry may be simplified. This may also be useful for ripple counters which may be used to count through a variable modulo-N count range.

In FIG. 8, the control circuit 48 generally comprises a register 82 (or a flip-flop arranged as a register) for holding the desired reset value supplied via the external input 80. The control circuit 48 may further comprise an XOR gate 84 for receiving an output from the register 82 and the flip-flop output signal 32, for comparing the two states. If the flip-flop output signal 32 matches the desired state, then the output from the XOR gate 84 may be logic 0. If the flip-flop output signal 32 does not match the desired state, then the output from the XOR gate may be logic 1.

The output from the XOR gate 84 may be coupled to a flip-flop 86, which may be clocked by the reset input 52. The output from the flip-flop 86 generally provides the control signal 50 for controlling the controllable inverter 46. Upon receipt of the reset signal at input 52, the output from the XOR gate 84 may be fed forward through the flip-flop 86 as the control signal 50. A logic 0 generally indicates that the flip-flop output signal 32 may be the same as the desired reset value, for controlling the controllable inverter 46 not to invert the output signal 42 with respect to the flip-flop output signal 32. A logic 1 generally indicates that the flip-flop output signal 32 may not match the desired reset value, for controlling the controllable inverter 46 to invert the output signal 42 with respect to the flip-flop output signal 32, to achieved the correct reset state.

It will be appreciated that if the controllable inverter 46 has an opposite function (such that a logic 0 control signal produces an inverted output), then the output from the flip-flop 86 may be inverted, or the output of the XOR gate 84 may be inverted.

As with the first example of the control circuit 48, the reset operation may be triggered by a transition edge of the reset signal applied as a clock signal to the flip-flop 86. This provides the same advantages as those mentioned above, compared to the conventional level-driven reset circuitry of conventional flip-flops 12.

On application of power to the ripple counter circuit 54 (e.g., FIG. 3), the count value may be unknown. Application of a sufficient number of clock events may cause the ripple counter 54 to overflow, which may force the counter 54 into a known state. For this reason, the reset circuits 48 and 48' described may not themselves require reset. Since the reset circuits operate at low rates (compared to the first counter stage 28 in the ripple counter 54) they may be reset in the conventional way without affecting overall performance.

It will be appreciated that the foregoing description is merely illustrative of preferred forms of the invention, and that various modifications and equivalents may be used within the scope of the invention. Accordingly, the appended claims are intended to be construed broadly to cover all such modifications and improvements.

What is claimed is:

1. A counter stage comprising:
   a flip-flop configured to toggle a first signal between a first and a second state in response to a count signal applied to a clock input to effect a counting operation; and
   a controllable inverter configured to (A) generate an output signal in response to said first signal and (B) reset said output signal to a predetermined state without changing said state of said first signal by one of (i) inverting and (ii) not inverting said first signal.

2. The counter stage according to claim 1, wherein said flip-flop is absent internal reset circuitry for resetting said flip-flop.

3. The counter stage according to claim 1, wherein said counter stage is operable in a first cycle in which said output signal is out of phase with respect to said first signal, and in a second cycle in which said output signal is in phase with said first signal.

4. The counter stage according to claim 3, wherein a reset operation is effected by switching said counter stage from one to another of said first and said second cycles.

5. The counter stage according to claim 1, wherein said controllable inverter comprises a multiplexer having (i) a first input receiving said first signal, (ii) a second input receiving an inverted first signal, and (iii) a control input for selecting either said first input or said second input.

6. The counter stage according to claim 1, wherein said controllable inverter comprises an exclusive-OR gate having (i) a first input receiving said first signal, and (ii) a second input receiving a control signal for controlling said controllable inverter.

7. The counter stage according to claim 1, further comprising a control circuit configured to generate a control signal for controlling said controllable inverter.

8. The counter stage according to claim 7, wherein said control signal is a binary signal, and said control circuit is operable to toggle said control signal from a first control state to a second control state to effect a reset operation.

9. The counter stage according to claim 8, wherein the control circuit is further operative to toggle said control signal alternately between said first and said second control states to effect consecutive reset operations.

10. The counter stage according to claim 7, wherein said control circuit comprises a flip-flop configured to toggle said control signal in response to a reset signal applied to said counter stage.

11. The counter stage according to claim wherein said control circuit comprises a comparator configured to (i) compare said first signal with a desired reset state and (ii) generate said control signal.

12. The counter stage according to claim 11, wherein said comparator comprises an exclusive-OR gate.

13. A counter stage of a counter comprising:
   a first flip-flop configured to toggle a first signal between a first and a second state in response to a count signal applied to a clock input to effect a counting operation; and a reset circuit configured to reset said counter stage to a predetermined state in response to a reset signal applied thereto, said reset circuit being responsive to a transition edge of said reset signal, wherein said counter comprises a ripple counter.

14. The counter stage of claim 13, wherein said reset circuit comprises a second flip-flop having a clock input for receiving said reset signal.

15. The counter stage of claim 13, wherein said reset circuit is operable to reset said counter stage to a predetermined state without changing said state of said first signal.

16. A counter comprising a plurality of counter stages, at least one of said counter stages comprising:

a flip-flop configured to toggle a first signal between a first and a second state in response to a count signal applied to a clock input to effect a counting operation; and a reset circuit configured to reset said counter stage to a predetermined state without changing said state of said first signal, wherein said counter comprises a ripple counter.

17. The counter of claim 16, wherein said at least one of said counter stages is a first of said counter stages.

18. The counter of claim 16, further comprising a detection circuit configured to (i) detect when the counter has reached a predetermined count value, and (ii) generate a counter reset signal in response thereto.

19. A counter stage comprising:

means for toggling a first signal between a first and a second state in response to a count signal applied to a clock input to effect a counting operation; and means for generating an output signal by selectively inverting said first signal to reset said counter stage to a predetermined state without changing said state of said first signal.

20. A counter stage of a counter comprising:

means for toggling a first signal between a first and a second state in response to a count signal applied to a clock input to effect a counting operation; and means for resetting said counter stage to a predetermined state in response to a reset signal applied thereto, said means being responsive to a transition edge of said reset signal, wherein said counter comprises a ripple counter.

21. A method of counting comprising:

(A) toggling a first signal between a first state and a second state in response to a count signal to effect a counting operation;

(B) generating an output signal by selectively inverting said first signal; and (C) resetting said output signal to a predetermined state without changing said state of said first signal.

* * * * *